(12) United States Patent
Stanton et al.

(10) Patent No.: US 7,754,395 B2
(45) Date of Patent: Jul. 13, 2010

(54) METHODS OF FORMING AND USING RETICLES

(75) Inventors: William Stanton, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 519 days.

(21) Appl. No.: 11/750,165

(22) Filed: May 17, 2007

(65) Prior Publication Data
US 2008/0286699 A1 Nov. 20, 2008

(51) Int. Cl.
*G03F 1/00* (2006.01)
(52) U.S. Cl. .......................................... 430/5; 430/394
(58) Field of Classification Search ...................... 430/5, 430/22, 322, 323, 394
See application file for complete search history.

(56) References Cited

U.S. PATENT DOCUMENTS

| 4,980,198 | A | | 12/1990 | Dowben et al. | |
|---|---|---|---|---|---|
| 5,387,484 | A | * | 2/1995 | Doany et al. ................... | 430/5 |
| 6,048,650 | A | * | 4/2000 | Lin ................................ | 430/5 |
| 6,656,539 | B1 | | 12/2003 | Haight et al. | |
| 2004/0067422 | A1 | | 4/2004 | Park et al. | |
| 2007/0172745 | A1 | * | 7/2007 | Smith ............................. | 430/5 |

FOREIGN PATENT DOCUMENTS

| JP | 10161297 A | 6/1998 |
|---|---|---|
| WO | 2006133729 A1 | 12/2006 |
| WO | PCT/US2008/060443 | 3/2009 |

OTHER PUBLICATIONS

Park Jong Rak et al: "Improvement of shot uniformity on a wafer by controlling backside transmittance distribution of a photomask" Proceedings of SPIE, The International Society for Optical Engineering 2003, vol. 5040 I, pp. 553-560.
Zait Eitan et al: "CD variations correction by local transmission control of photomasks done with a novel laser based process" Proceedings of SPIE, The International Society for Optical Engineering; Metrology, Inspection, and Process Control for Microlithography 2006, vol. 6152 II, 6 pages.

* cited by examiner

*Primary Examiner*—Mark F Huff
*Assistant Examiner*—Stewart A Fraser
(74) *Attorney, Agent, or Firm*—Wells St. John P.S.

(57) ABSTRACT

Some embodiments include methods of treating reticles to provide backside masking across regions of the reticle to compensate for problems occurring during photolithographic processing. The problems may be, for example, defects in the reticle, problems associated with deposition or development of photoresist, or problems associated with substrate topography. The masking may alter one or both of transmission of electromagnetic radiation through the masked regions, and polarization of electromagnetic radiation passed through the masked regions. Some embodiments include reticles having patterns along front sides for patterning electric magnetic radiation, and masks across portions of the backsides to at least partially block transmission of electromagnetic radiation through portions of the patterns.

10 Claims, 6 Drawing Sheets

METHODS OF FORMING AND USING RETICLES

TECHNICAL FIELD

Reticles, methods of treating reticles, methods of configuring reticles, and methods of using reticles.

BACKGROUND

Photolithography is commonly used during formation of integrated circuits on semiconductor wafers. More specifically, a form of radiant energy (such as, for example, ultraviolet light) is passed through a radiation-patterning tool and onto a radiation-sensitive material (such as, for example, photoresist) associated with a semiconductor wafer. The radiation-patterning tool can be referred to as a photomask or a reticle. The term "photomask" traditionally is understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized interchangeably to refer to radiation-patterning tools that define patterns across some or all of a wafer.

Reticles contain light restrictive regions (for example, totally opaque or attenuated/half toned regions) and light transmissive regions (for example, totally transparent regions) formed in a desired pattern. A grating pattern, for example, can be used to define parallel spaced conductive lines on a semiconductor wafer.

Photolithography initially comprises forming a layer of radiation-sensitive material (such as, for example, photosensitive resist material, which is commonly referred to as photoresist) over a wafer. Subsequently, radiation is passed through the reticle onto the layer of photoresist, and a pattern defined by the reticle is transferred onto the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

An example prior art photolithography process is described with reference to FIGS. 1-3.

FIG. 1 shows a reticle 10 comprising a base (or body) 12. A series of radiation-altering structures 11, 13, 15 and 17 are provided over a surface of the body, and a series of regions (specifically gaps) 14, 16 and 18 are between the radiation-altering structures. The radiation-altering structures 11, 13, 15 and 17, together with the gaps 14, 16 and 18 define a pattern imparted to radiation passing through reticle 10. Although the pattern imparted to the radiation is defined by the structures and gaps, the pattern may differ from the specific pattern of the structures and gaps due to interference effects occurring in the radiation as it passes through the reticle. Such interference effects are accounted for in the design of the reticle.

The body 12 may comprise, consist essentially of, or consist of material transparent, or at least substantially transparent, to radiation passed through the reticle during photolithography; and may, for example, comprise, consist essentially of, or consist of quartz. The radiation-altering structures 11, 13, 15 and 17 may comprise materials which block a significant percentage of electromagnetic radiation from passing therethrough (for instance, chromium-containing materials), and/or may comprise materials which shift the phase of electromagnetic radiation passing therethrough (for instance, molybdenum silicide). The radiation-altering structures may comprise materials formed across a surface of base 12 (as shown) or may comprise patterns etched into base 12 (for instance, may comprise grating patterns etched into base 12 to shift a phase of electromagnetic radiation passing through the base).

The structures 11, 13, 15 and 17 may define relatively opaque portions of the reticle, and the gaps 14, 16 and 18 may define relatively transparent portions of the reticle. The terms "relatively opaque" and "relatively transparent" are utilized to indicate regions which are more opaque or transparent relative to one another, respectively, and may include, but are not limited to, regions which are completely opaque or completely transparent, respectively. Together, the relatively opaque regions and relatively transparent regions pattern radiation passing through the reticle.

The regions 14, 16 and 18 are shown to consist of unmodified locations of base 12. In some application the regions are modified prior to photolithography by, for example, forming materials within the regions, and/or by recessing at least portions of the regions into the base.

The base 12 has a pair of opposing sides 7 and 9. The pattern of structures 11, 13, 15 and 17, and regions 14, 16 and 18, is formed along side 7. The patterned side 7 may be referred to as a front side of the reticle, and the opposing side 9 may be referred to as a backside of the reticle.

FIG. 2 shows an apparatus 20 utilizing reticle 10 for patterning radiation. Apparatus 20 contains a semiconductor substrate 22 having a radiation-sensitive material 26 over a base 24. The base may comprise, consist essentially of, or consist of monocrystalline silicon. The radiation-sensitive material may comprise positive or negative photoresist. The radiation-sensitive material may be particularly sensitive to one or more wavelengths of radiation, such as, for example, wavelengths shorter than 300 nanometers.

The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 24 is shown to be homogenous, the base may comprise numerous layers in some applications. For instance, base 24 may contain one or more layers associated with integrated circuit fabrication. In such applications, such layers may correspond to one or more of metal interconnect layers, barrier layers, diffusion layers, insulator layers, etc.

The semiconductor substrate 22 is provided beneath the front side 7 of reticle 10. Electromagnetic radiation 28 is patterned by passing it through reticle 10. The radiation may comprise a plurality of wavelengths, with one or more of the wavelengths being the predominate wavelengths utilized for patterning the radiation-sensitive material. The wavelengths predominately utilized for patterning the radiation-sensitive material may be referred to as the "primary" wavelengths utilized in the printing of a pattern into the radiation-sensitive material.

The patterned radiation impacts radiation-sensitive material 26 to print a pattern within the radiation-sensitive material. The printed pattern comprises exposed regions 30 and non-exposed regions 32. The exposed and non-exposed regions are shown separated by dashed-line boundaries to assist in illustrating the exposed and non-exposed regions.

FIG. 3 shows semiconductor substrate 22 after development of the radiation-sensitive material 26 to remove the exposed regions 30 selectively relative to the unexposed regions (alternatively, the development may remove the unexposed regions selectively relative to the exposed regions). The development forms a plurality of openings 34, 36 and 38 extending through the radiation-sensitive material to the underlying base 24. In subsequent processing, an etch may be conducted to extend the openings into the base.

In many semiconductor fabrication processes, it is desired to form a large array of identical openings extending through a radiation-sensitive material. For instance, is often desired for memory to comprise large arrays of identical structures. FIG. 3 shows a desired result in which the openings are uniformly created to the same dimensions as one another (in other words, in which the openings have uniform critical dimensions across base 24). In practice, such desired result is often not achieved.

FIG. 4 illustrates an example problem that may occur during formation of the openings 34, 36 and 38. Specifically, FIG. 4 shows that opening 36 has not entirely penetrated through the radiation-sensitive material 26. Such may be due to a problem with the substrate 24 (for instance, the substrate may not have a planar topography of the upper surface), a problem with the radiation-sensitive material (for instance, the radiation-sensitive material may not have been formed to uniform thickness across the substrate), or a problem during the exposure of FIG. 2 (for instance, one of the openings in the pattern on the reticle may not have had appropriate dimension relative to the other openings and/or the intensity of electromagnetic radiation through part of the reticle may not have been the same as the intensity through another part of reticle).

FIG. 5 illustrates another example problem that may occur during formation of openings 34, 36 and 38. Specifically, the openings 34, 36 and 38 are not uniform in critical dimension; with openings 34 and 38 being shown to be wider than opening 36. Such problem may result from, for example, non-uniformity in dimensions of the openings in the pattern on the reticle.

The same reticle and processing methods may be utilized for sequential processing of numerous substrates. A problem that occurs on one substrate will frequently occur on all of the sister substrates processed with the same reticle and processing conditions. Accordingly, it is desired to develop procedures for curing photolithographic problems before they are propagated to a large number of substrates.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever decreasing dimensions of structural elements, and ever increasing requirements for precision and accuracy in radiation patterning.

Control of critical dimension uniformity during photolithographic formation of openings may be of increasing importance as ever higher levels of integration are sought for integrated circuit fabrication. Efforts have been made to improve critical dimension uniformity by improving the reticles utilized for photolithography. One method is to darken a reticle by using a laser to damage quartz. The damaged quartz attenuates light passing through the reticle, which may induce birefringence, and which may thereby affect critical dimension by reducing the degree of polarized light (in other words, by shifting a phase of the polarized light). This may be undesirable in some applications.

DETAILED DESCRIPTION OF THE ILLUSTRATED EMBODIMENTS

Some embodiments include methods of improving critical dimension uniformity of openings formed during photolithography. Such improvement may include provision of half-tone and/or bulk attenuating structures on reticle backsides.

Some embodiments include deposition of a material across part of the backside of a reticle to attenuate incoming light to improve critical dimension uniformity. The deposition may include laser assistance, and may be, for example, laser-enhanced chemical vapor deposition. The deposited material may be formed in any desired pattern. In some embodiments, the material may comprise chrome-containing dots (or other chrome-containing elements) on a pitch which changes transmission, and in other embodiments may comprise a complete monolayer (or other thickness layer) across a substantial portion of a pattern to block utilization of that portion of the pattern during a photolithographic process.

In some embodiments, the critical dimensions of a pattern on a reticle are measured to create a map of the critical dimension uniformity, and then a map for correction is calculated and the treatment of the backside conducted. In other embodiments, the critical dimensions of a photolithographically-formed pattern on a substrate are measured to create a map of the critical dimension uniformity, and then a map for correction is calculated and the treatment of the backside of the reticle utilized for the photolithography is conducted.

In embodiments in which masks are formed on reticle backsides, the masks may be removed in subsequent processing so that the same reticles may be used for forming different types of patterns on different substrates.

In some embodiments, a polarizing material or pattern is provided on the backside of the reticle in addition to, or alternatively to, a transmission-blocking (in other words, attenuating) mask. A polarizing material may be tailored to address polarization issues (for instance, birefringence) in a reticle.

The attenuating masks and polarizing treatments may be utilized to produce pixel and/or zone-based corrections for attenuation, and/or polarization. The attenuating masks and polarizing treatments may improve critical dimension uniformity produced with a photolithographic process and/or may improve polarization purity of radiation passing through a reticle during a photolithographic process.

Figure 1:
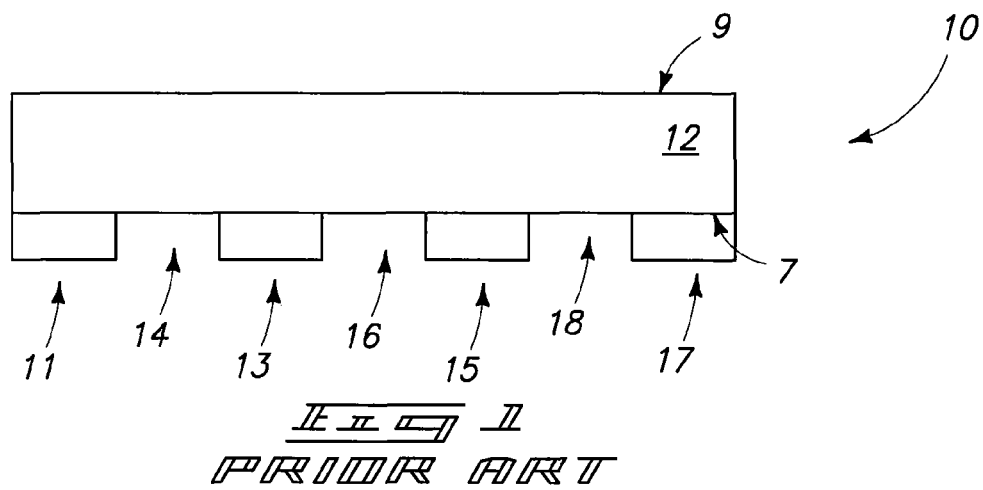
FIG. 1 is a diagrammatic cross-sectional view of a prior art reticle.
Figure 2:
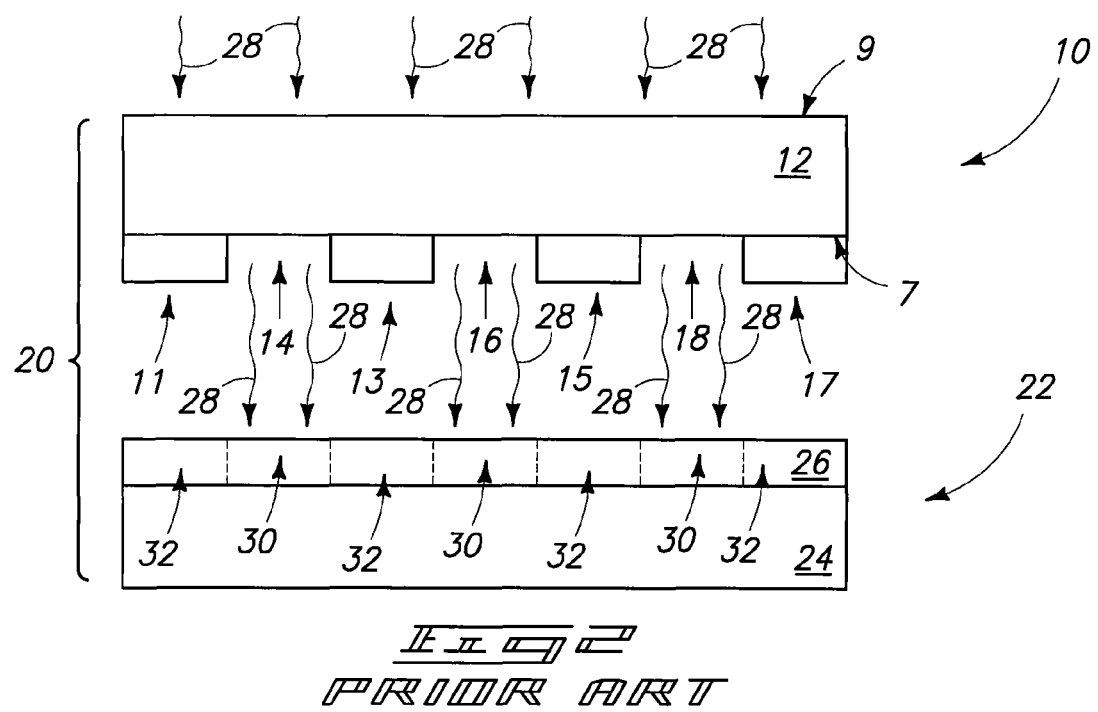
FIG. 2 is a diagrammatic cross-sectional view of a prior art apparatus utilizing the reticle of FIG. 1 for patterning of a radiation-sensitive material associated with a semiconductor substrate.
Figure 3:
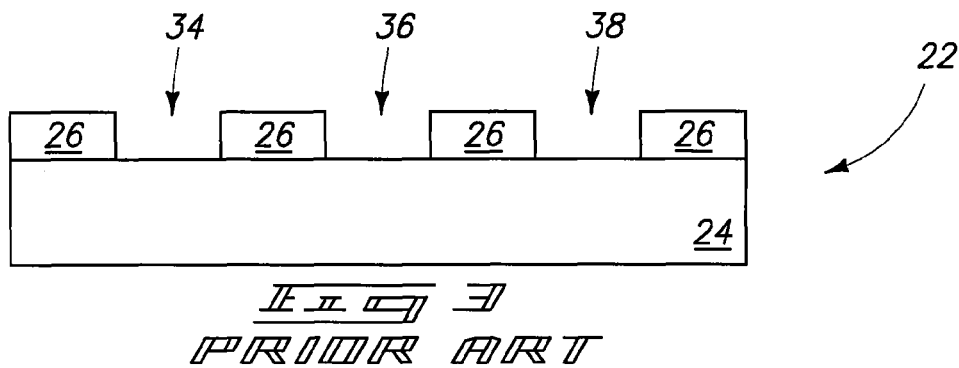
FIG. 3 is a view of the semiconductor substrate of FIG. 2 shown at a prior art processing stage subsequent to that of FIG. 2.
Figure 6:
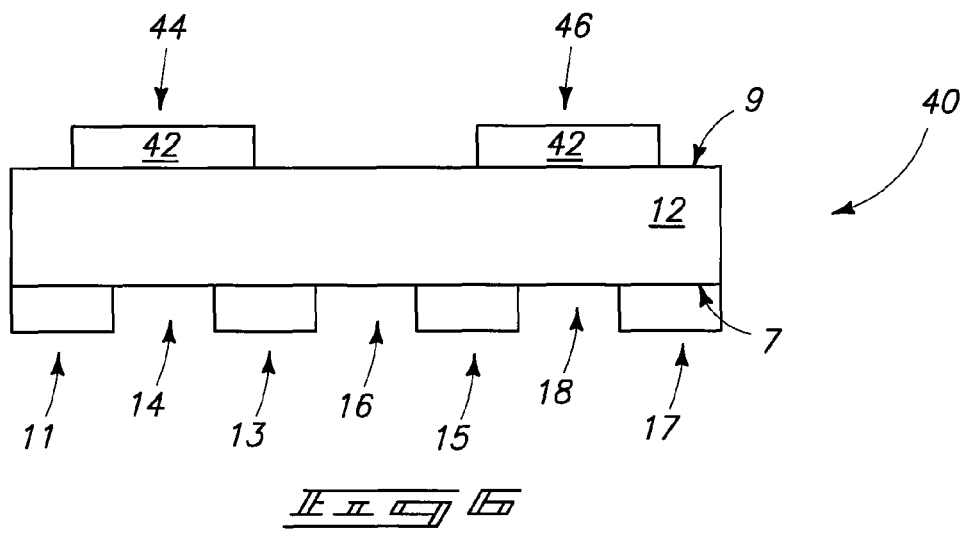
FIG. 6 is a diagrammatic cross-sectional view of an embodiment of a reticle.

An example embodiment reticle 40 is shown in FIG. 6. Similar number will be used to describe reticle 40 as is utilized to describe the prior art reticle of FIG. 1, where appropriate.

The reticle 40 comprises the base 12 having the front side 7 and the opposing backside 9. The reticle 40 also comprises a pattern over the front side 7, with such pattern including structures 11, 13, 15 and 17, and the regions 14, 16 and 18 between the structures. In contrast to the prior art reticle of FIG. 1, the reticle of FIG. 6 comprises a patterned mask 42 on the backside 9 of the reticle. The mask 42 comprises a first portion 44 over region 14, and a second portion 46 over region 18.

Figure 4:
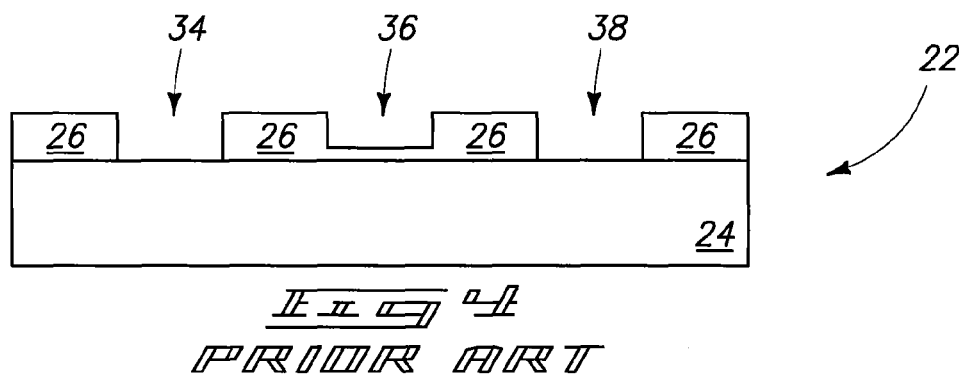
FIG. 4 is a view of the semiconductor substrate of FIG. 2 shown at a prior art processing stage subsequent to that of FIG. 2 illustrating a prior art problem.
Figure 5:
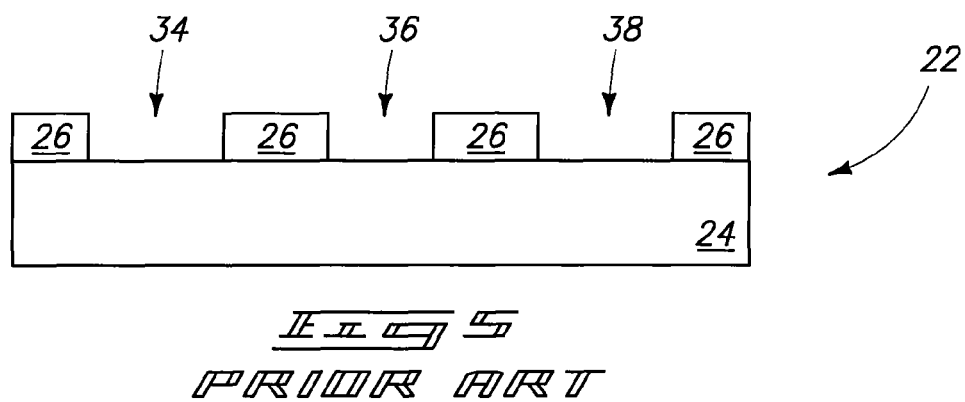
FIG. 5 is a view of the semiconductor substrate of FIG. 2 shown at a prior art processing stage subsequent to that of FIG. 2 illustrating another prior art problem.

In some embodiments, a prior art reticle may be utilized to form a substrate having the problem shown in FIG. 4. The problem may be identified as an undesired feature within the gap 36, with such undesired feature corresponding to a film of resist 26 remaining within gap 36 after development of the resist. The remaining film may be due to one or more of various problems associated with the reticle or with the photolithographic process. For instance, the reticle may have higher transparency through regions which pattern gaps 34 and 38 than through the region which patterns gap 36; and/or the resist 26 may be thicker over the region where gap 36 is formed then over the regions where gaps 34 and 38 are formed. Problems due to defects in the reticle, either due to materials in the reticle or due to problems with the pattern on a reticle, may be considered to be due to characteristics of the reticle. Problems due to formation of the photoresist or chemical development of the photoresist may be considered to be due to attributes other than characteristics of the reticle.

Once the undesired feature is identified as part of the photolithographically patterned substrate, the reticle may be treated with the mask shown in FIG. 6 to at least diminish, and in some embodiments entirely eliminate, similar undesired features from occurring in additional substrates photolithographically patterned using the reticle.

The masking material 42 may be a material of suitable opacity formed to suitable thickness to reduce transmission of electromagnetic radiation through features 14 and 18 by any desired amount. For instance, the mask may reduce transmission by from about one percent to at least about 90 percent, and may for example, reduce transmission by at least about 10 percent or at least about 50 percent. The material 42 may comprise a single composition, or may comprise multiple compositions. Although the material 42 is shown to be homogeneous, in other embodiments the material may comprise multiple discrete layers. In some embodiments, material 42 may comprise, consist essentially of, or consist of one or more of aluminum, chromium, gold, molybdenum, platinum and tungsten. In other embodiments, material 42 may comprise other materials. In some embodiments, material 42 may comprise a composition which shifts phase (in other words, changes polarization) of electromagnetic radiation passing therethrough, with an example composition being molybdenum silicide. Material 42 may thus, for example, comprise, consist essentially of, or consist of molybdenum silicide. The molybdenum silicide may reduce transmission of electromagnetic radiation in addition to shifting a phase of the electromagnetic radiation.

The masking material 42 may be formed by any suitable process including, for example, chemical vapor deposition (CVD), atomic layer deposition (ALD) and/or physical vapor deposition (PVD). In some embodiments, the material may be formed utilizing a laser-assisted process. Such laser-assisted process may be a laser-assisted deposition process in which a precursor is exposed to laser-emitted radiation to form a deposit from the precursor in a desired pattern across the backside of the reticle. Alternatively, the laser-assisted process may be a conventional deposition process which forms material across a large region of the backside (or, in some embodiments, an entirety of the backside), and in which laser-emitted radiation is utilized to obliterate some of the deposited material to form a desired pattern from the material on the backside.

An example laser-induced chemical vapor deposition (LICVD) process is as follows. A reticle is enclosed in a reaction chamber with an organometallic compound which includes a metal to be deposited (for example, trimethylaluminum may be utilized to deposit aluminum). A focused laser is trained at a point of the reticle backside. The laser heats a localized area of the reticle backside. The heat causes nearby organometallic molecules to thermally decompose and deposit metal on the heated area.

Another example LICVD process is a photolytic process in which an organometallic molecule is photochemically decomposed at or near a reticle backside surface utilizing a laser operating at a wavelength corresponding to a photon energy which exceeds a chemical bond energy of the organometallic molecule. A photolytic process may have a linear dependence on laser light intensity. A number of separate molecule-photon interactions may be utilized to break a number of bonds in order to release elemental metal for deposition. A portion of the photon energy which exceeds a particular molecular bond energy may initially be converted to vibrational energy of the organometallic molecule, and subsequently be dissipated to surrounding gas molecules as heat. The photolytic process may thus have some inefficiency relative to the thermal process in that excess energy may not contribute to additional bond-breaking interactions.

In some embodiments, the laser may be a mode-locked titanium-doped sapphire (Ti:Sapphire) laser. The mode-locked Ti:Sapphire laser output may be characterized by a pulse time (which may be characterized by a full width half max value) of less than or equal to one picosecond (for instance, less than or equal to 125 femptoseconds). An advantage of using short pulse light may be that if the pulse rate is maintained sufficiently low, high intensity light may be obtained without additional heating. It may be advantageous to use optical radiation above deep ultraviolet (in other words, above 350 nanometers) to allow for use of non-deep ultraviolet optical components. For many applications, wavelengths above deep ultraviolet will have sufficient resolution. If higher resolution is desired, wavelengths within the deep ultraviolet may be utilized.

The vapor pressures of donor compounds (specifically, organometallic compounds in some embodiments) may be at least about one millitorr, and in some embodiments maybe at least about 10 millitorr. Vapor pressures of donor compounds may be temperature dependent. The desired donor vapor pressures may be selected to obtain a desired high rate of evaporation of the donor compounds, to ultimately provide a reasonable rate of delivery of the donor compounds to a reticle which is to be treated. Some donor compounds which may be acceptable for some embodiments include, for example, chromium hexacarbonyl (which has a vapor pressure of from 200 millitorr to 300 millitorr at room temperature), molybdenum hexacarbonyl (which has a vapor pressure of from 100 millitorr to 200 millitorr at room temperature), tungsten hexacarbonyl (which has a vapor pressure of from 20 millitorr to 100 millitorr at room temperature), and dimethyl-gold-trifluoro-acetylacetonate (which has a vapor pressure of about 100 millitorr at about 25° C.). Other example donor compounds include aluminum hexafluoroacetylacetonate and platinum hexafluoroacetylacetonate.

Figure 7:
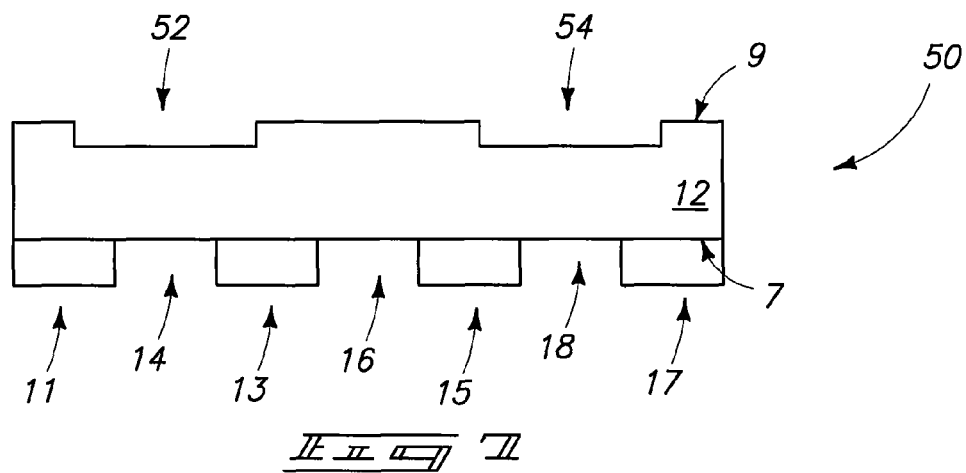
FIGS. 7 and 8 are a diagrammatic cross-sectional view, and top view, respectively, of another embodiment of a reticle. The cross-section of FIG. 7 is along the line 7-7 of FIG. 8.
Figure 8:
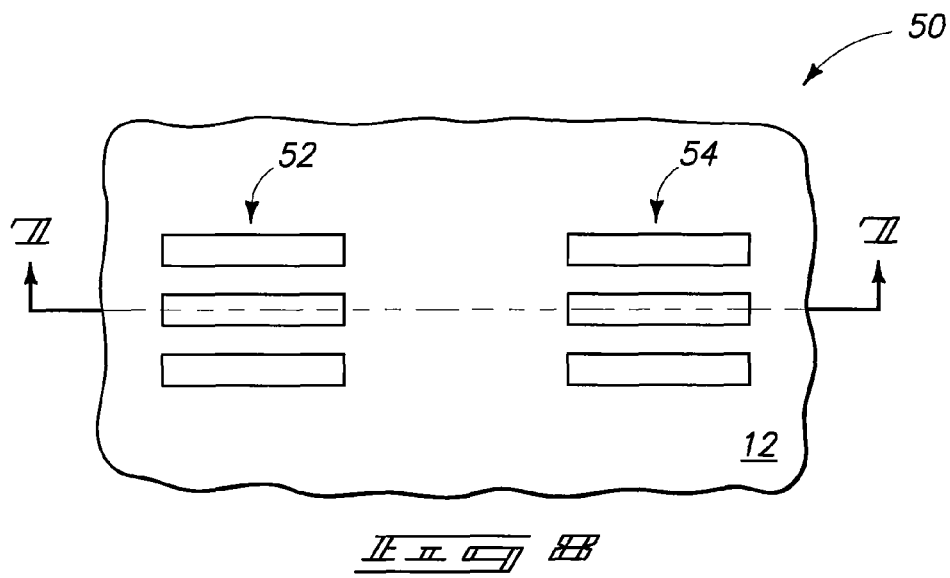

FIGS. 7 and 8 show another example modification which may be made to the backside of a reticle to correct for defects occurring in a photolithographic process. In referring to FIGS. 7 and 8, similar numbering will be used as is utilized above in describing FIGS. 1-6, where appropriate.

FIGS. 7 and 8 show a reticle 50 comprising the base 12 having the front side 7 and the backside 9. The reticle 50 also comprises a pattern over the front side 7; with such pattern containing structures 11, 13, 15 and 17, together with regions 14, 16 and 18 between the structures.

The reticle 50 further comprises a pair of grating patterns 52 and 54 on the backside 9 of the reticle. Grating pattern 52 is over region 14 of the patterned front side of the reticle, and grating pattern 54 is over region 18 of the patterned front side of the reticle. The grating patterns may shift polarization of the electromagnetic radiation passing through features 14 and 18 relative to the polarization of radiation passing through feature 16. Such can modify the radiation pattern produced by the reticle (for instance, the pattern produced during processing of the type shown in FIG. 2), which may alleviate, or even eliminate, some types of defects. The shift in phase may alter the critical dimensions of an opening produced by radiation passing through the patterns of the reticle, which may alleviate problems of the type shown in FIG. 5. Thus, uniformity of critical dimensions of photolithographically formed openings may be improved.

Other methods of shifting polarization may be used in addition to, or alternatively to, the grating pattern of FIGS. 7 and 8. For instance, phase shifting material may be formed over the backside 9 as a patterned mask, with exemplary phase shifting material being molybdenum silicide.

In some embodiments, the backside masks (for instance, the masks described with reference to FIG. 6) may be combined with the backside grating patterns (for instance, the grating patterns described with reference to FIGS. 7 and 8) to simultaneously provide correction for multiple types of defects. For example, if a photolithographic process has both problems of the type shown in FIG. 4 and problems of the type shown in FIG. 5, the combination of masks and grating patterns may simultaneously alleviate, or in some embodiments eliminate, both types of problems.

Figure 9:
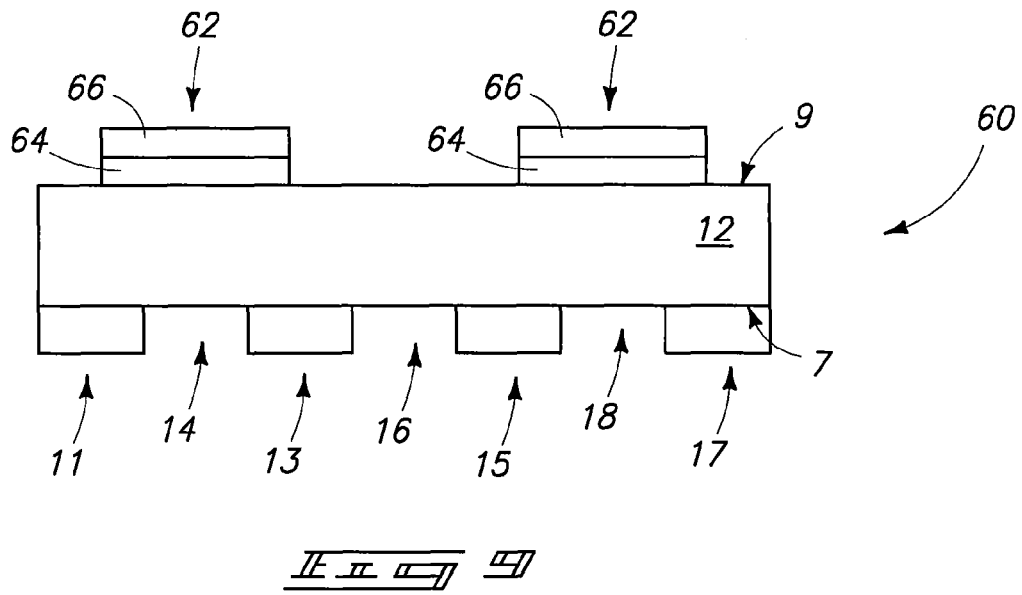
FIG. 9 is a diagrammatic cross-sectional view of another embodiment of a reticle.

FIG. 9 shows another example modification which may be made to the backside of a reticle to correct for defects occurring in a photolithographic process. In referring to FIG. 9, similar numbering will be used as is utilized above in describing FIGS. 1-8, where appropriate.

FIG. 9 shows a reticle 60 comprising the base 12 having the front side 7 and the backside 9. The reticle 60 also comprises a pattern over the front side 7; with such pattern containing structures 11, 13, 15 and 17, and the regions 14, 16 and 18 between the structures. The reticle 60 additionally comprises a patterned mask 62 on the backside 9 of the reticle. The mask 62 comprises a portion over region 14, and comprises another portion over region 18.

The mask 62 is shown to comprise two discrete layers 64 and 66. The layers 64 and 66 may individually comprise any suitable compositions, and may, for example, comprise, consist essentially of, or consist of one or more of aluminum, chromium, gold, molybdenum, platinum and tungsten. In some embodiments, one of the layers shifts phase of electromagnetic radiation passing therethrough, and the other reduces transmission of the radiation. For instance, layer 64 may consist of molybdenum silicide, and layer 66 may consist of a chromium-containing material. The combined layers 64 and 66 may thus simultaneously alleviate, or in some embodiments eliminate, both the type of problem shown in prior art FIG. 4, and the type of problem shown in prior art FIG. 5.

The embodiments of FIGS. 6-9 illustrate applications in which masking material is provided over a backside of a reticle to correct for defects in a photolithographic process. In other embodiments, masking material may be removably formed on the backside of a reticle to enable the same reticle to be utilized for printing multiple different layouts. Specifically, a reticle may be formed to have a pattern which includes two or more different layouts which are desired to be printed in different photolithographic processes. Part of the pattern may be masked so that one layout is printed; and then either the entire pattern is printed for a different layout, or a different part of the pattern is masked so that an alternate layout may be printed. Example embodiments in which removable masking is applied to a reticle backside are described with reference to FIGS. 10-14.

Figure 10:
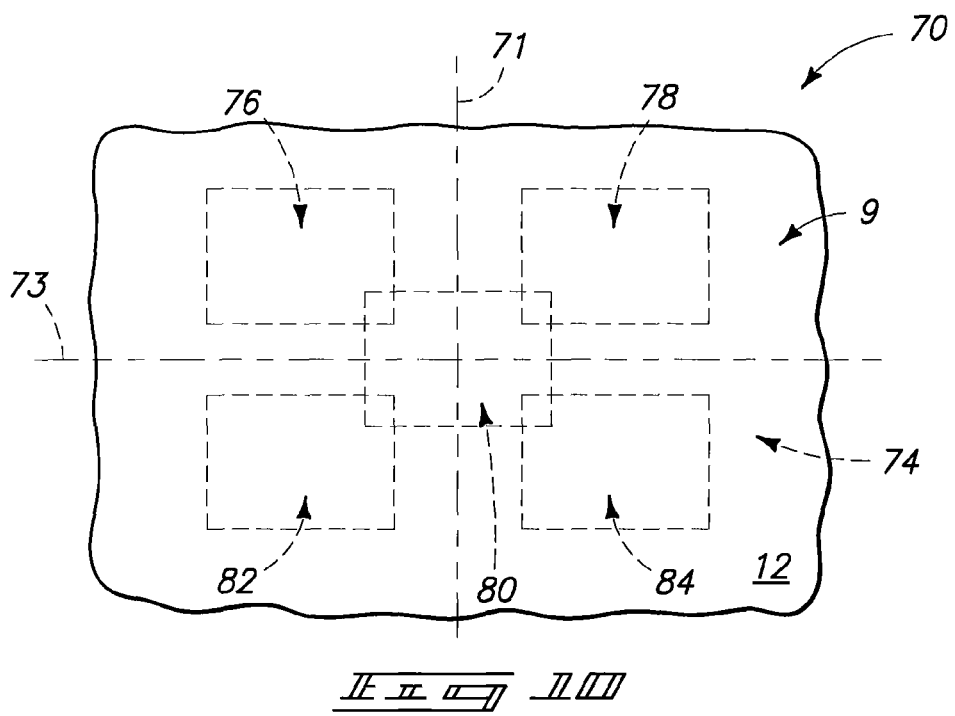
FIGS. 10-12 are top views of a reticle at various processing stages of an embodiment.

Referring to FIG. 10, a reticle 70 is illustrated. The reticle comprises the base 12 discussed above with reference to FIGS. 1-9. The base would comprise a front side and backside, but in the view of FIG. 10 only the backside 9 is visible. Specifically, FIG. 10 is a view of the reticle looking down on the backside. A pattern 74 is formed on the front side, and such pattern is diagrammatically illustrated in dashed-line view in FIG. 10. The dashed-line view indicates that the pattern is under base 12 relative to the view of FIG. 10.

The pattern is shown to comprise five primary sub-patterns 76, 78, 80, 82 and 84. The sub-patterns are illustrated as blocks, and some of the sub-patterns are shown to overlap with one another (specifically, sub-pattern 80 overlaps with the sub-patterns 76, 78, 82 and 84). The sub-patterns correspond to zones of the overall pattern. The individual zones may include any number of numerous specific features which are to be transferred to a substrate during a photolithographic process. For instance, one or more of the zones may include only patterns corresponding to a single feature, or very few features (for instance, such zones may pattern specific sensors, or specific logic elements); and one or more of the zones may include patterns corresponding to thousands, or even millions of features (for instance, such zones may pattern repeating units of a memory array).

The zones may be considered to be separate patterns tailored for separate applications. In some embodiments, it may be desired to use the zones to print a different arrangement of features on some substrates than on other substrates. For instance, some of the zones may correspond to printed features which are proprietary for one customer, whereas others of the zones may correspond to printed features which may be produced for numerous customers. In such applications, it may be desired to block the zone corresponding to the proprietary printed features when printing substrates for most customers, and then to unblock such zone when printing substrates for the customer that owns the proprietary information. As another example, one or more of the zones may correspond to a sensor or other feature that a first set of customers desire, others of the zones may correspond to features that a second set of customers desire; and yet others of the zones may correspond to features that both the first and second sets of customers desire. In such applications, it may be desired to block one set of zones when printing substrates for the first set of customers, and to then unblock the first set of zones and block a second set of zones when printing substrates for the second set of customers.

The reticle of FIG. 10 comprises symmetry. Specifically, the shown reticle comprises mirror symmetry along a vertical plane designated by dashed-line 71, and comprises additional mirror symmetry along a horizontal plane designated by dashed-line 73. In other embodiments, the reticle may be asymmetric.

Figure 11:
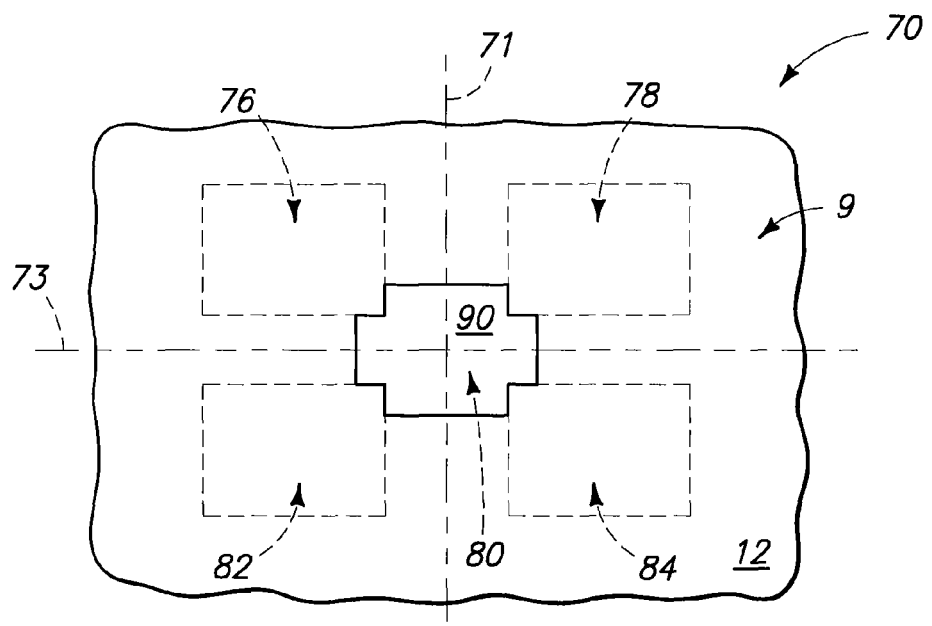
Figure 12:
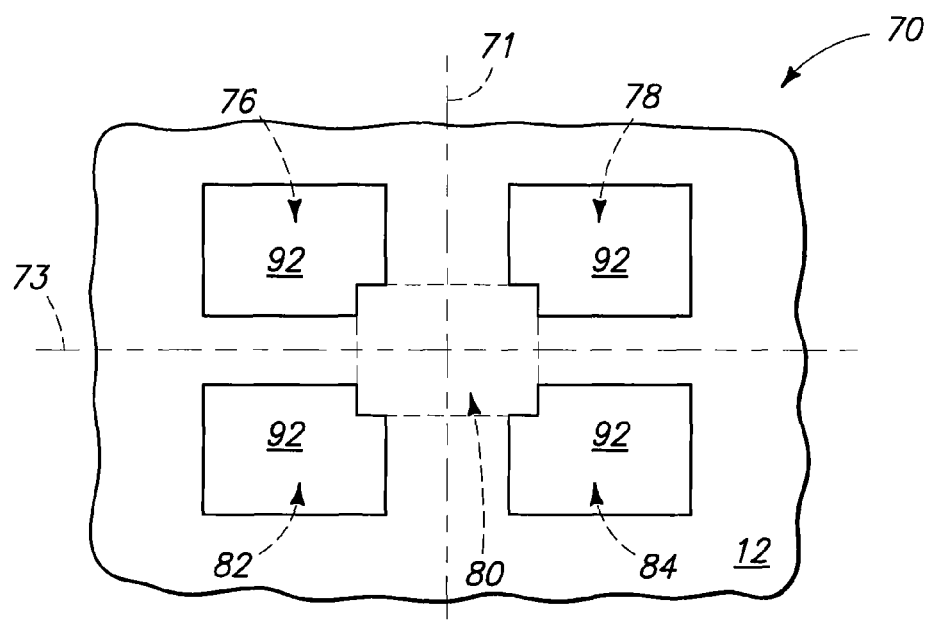

FIGS. 11 and 12 illustrate example masks that may be used to block one or more of the zones. Specifically, FIG. 11 shows a mask 90 patterned to block zone 80. The mask 90 may comprise one or more compositions suitable to block 99 percent or more of the transmission of electromagnetic radiation through zone 80; and may, for example, comprise, consist essentially of, or consist of one or more of aluminum, chromium, gold, molybdenum, platinum and tungsten. The mask 90 may block all electromagnetic radiation, or may selectively block at least the primary wavelengths of electromagnetic radiation utilized during the printing. For instance, if the only electromagnetic radiation which can print a particular radiation-sensitive material during a photolithographic process is radiation having a wavelength in the ultraviolet range or shorter, the mask may comprise a material which blocks electromagnetic radiation having wavelengths in the ultraviolet range or shorter, but which lets some other wavelengths of radiation pass. The passing of the other wavelengths of radiation through the mask will not detrimentally affect the photolithographic process since they don't print the radiation-sensitive material.

The mask may be removably applied to the backside of the reticle, and may be applied with any of the methods discussed above with reference to application of the masking material 42 of FIG. 6.

The mask 90 is substantially symmetric relative to the symmetry the reticle, and specifically comprises symmetry along the mirror planes 71 and 73. The mask is referred to as being "substantially" symmetric relative to the symmetry of the reticle to indicate that the mask is symmetric within limitations of fabrication, which may include, but is not limited to, embodiments which the mask is exactly symmetric relative to the symmetry of the reticle.

Referring to FIG. 12, mask 90 is removed and replaced with a patterned mask 92. The mask 90 may be removed with any suitable method. For instance, the mask may be removed with an etch, with laser-assisted obliteration, and/or with a polishing method. In an example embodiment, the mask may consist of a chromium-containing material, and may be removed with an etch comprising oxygen and chlorine.

Mask 92 is provided over multiple non-contiguous locations of the reticle, and specifically is provided over zones 76, 78, 82 and 84. The mask 92 may comprise one or more compositions suitable to block 99 percent or more of the transmission through zones 76, 78, 82 and 84; and may, for example, comprise, consist essentially of, or consist of one or more of aluminum, chromium, gold, molybdenum, platinum and tungsten.

Mask 92 is, like mask 90, substantially symmetric relative to the symmetry of the reticle.

The mask 92 may be removably applied to the backside of the reticle, and may be applied with any of the methods discussed above with reference to application of the masking material 42 of FIG. 6.

In subsequent processing, mask 92 may be removed and mask 90 reapplied so that reticle 70 may be alternately used for printing two different types of patterns. In other processing, reticle 70 may be used with no mask applied, so that all of zones 76, 78, 80, 82 and 84 may be printed. In yet other processing, a mask may be provided to block other combinations of zones 76, 78, 80, 82 and 84 besides the combinations specifically shown in FIGS. 11 and 12. Such other masks may be asymmetric relative to the reticle and may be provided over contiguous locations of the reticle, or over multiple non-contiguous locations of the reticle.

Figure 13:
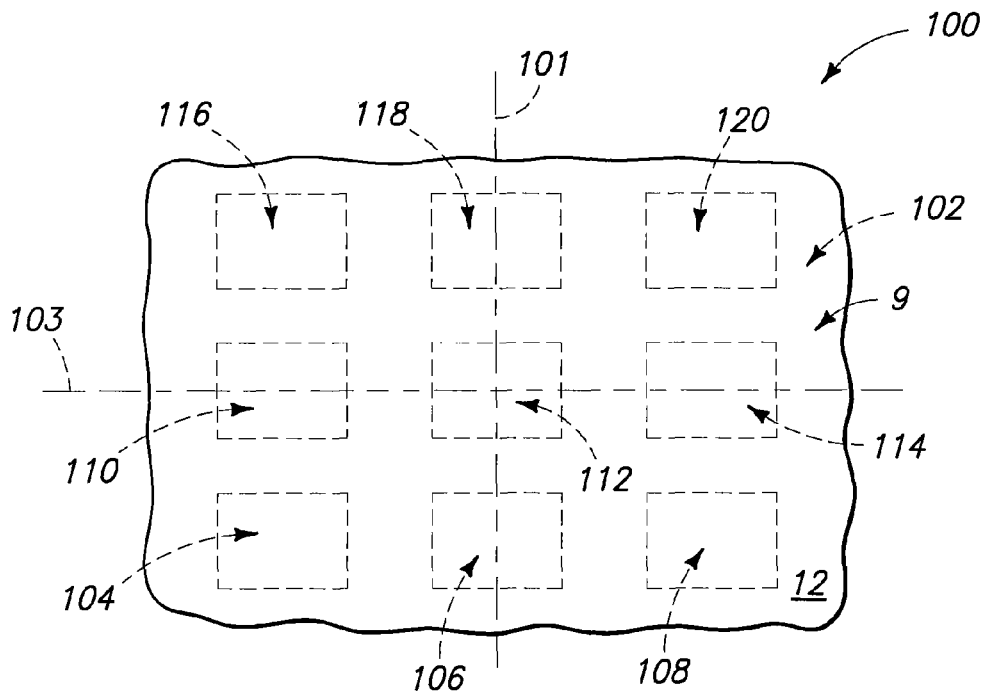
FIGS. 13 and 14 are top views of a reticle at various processing stages of another embodiment.
Figure 14:
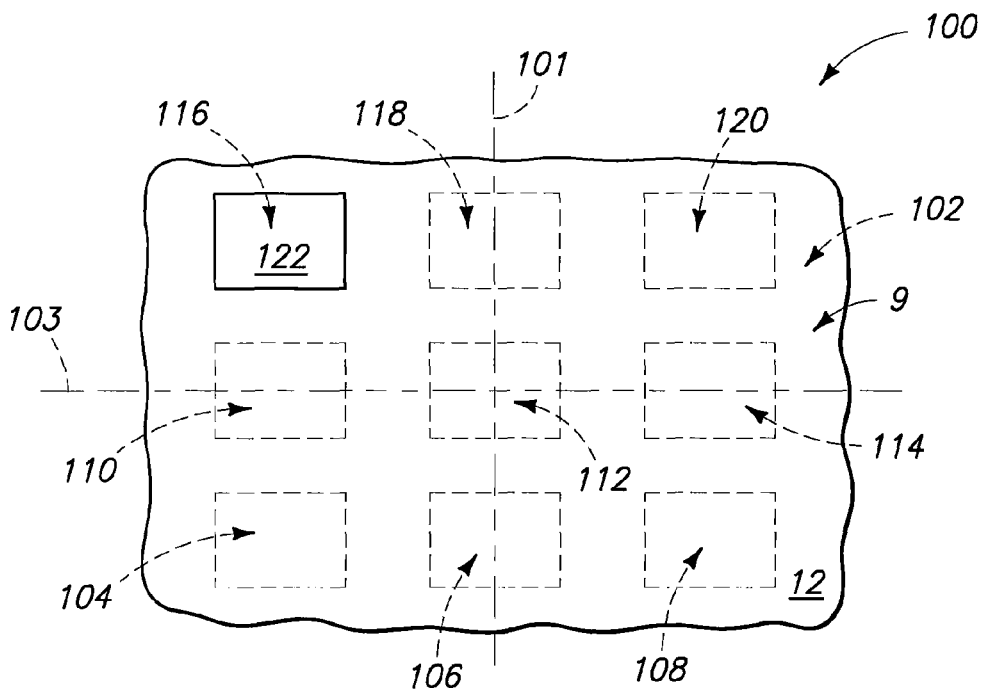

FIGS. 13 and 14 illustrate another example embodiment in which a removable mask may be provided across a backside of a reticle to selectively block some portions of the reticle during photolithographic printing.

Referring to FIG. 13, a reticle 100 is illustrated. The reticle comprises the base 12 discussed above with reference to FIGS. 1-9. The base would comprise a front side and backside, but in the view of FIG. 13 only the backside 9 is visible. Specifically, FIG. 13 is a view of the reticle looking down on the backside. A pattern 102 is formed on the front side, and such pattern is diagrammatically illustrated in dashed-line view in FIG. 13. The dashed-line view indicates that the pattern is under base 12 relative to the view of FIG. 13.

The pattern is shown to comprise nine primary sub-patterns 104, 106, 108, 110, 112, 114, 116, 118 and 120. The sub-patterns are illustrated as blocks, and none of the sub-patterns overlap with one another. The sub-patterns correspond to zones of the overall pattern. The individual zones may include any number of numerous specific features which are to be transferred to a substrate during a photolithographic process. For instance, one or more of the zones may include only patterns corresponding to a single feature, or very few features; and one or more of the zones may include patterns corresponding to thousands, or even millions of features. The zones are shown to be approximately the same size as one another, but in other embodiments the zones could have substantial variation in size relative to one another.

The reticle of FIG. 13 comprises symmetry. Specifically, the shown reticle comprises mirror symmetry along a vertical plane designated by dashed-line 101, and comprises additional mirror symmetry along a horizontal plane designated by dashed-line 103. In other embodiments, the reticle may be asymmetric.

The reticle may be utilized to print a pattern by passing radiation through all of the shown zones of pattern 102. In subsequent processing, a mask may be provided to block one or more of the zones prior to printing with others of the zones. For instance, FIG. 14 such shows a mask 122 patterned to block zone 116. The mask 122 may comprise one or more compositions suitable to block 99 percent or more of the transmission of electromagnetic radiation through zone 116; and may, for example, comprise, consist essentially of, or consist of one or more of aluminum, chromium, gold, molybdenum, platinum and tungsten. The mask 122 may block all electromagnetic radiation, or may selectively block at least the primary wavelengths of electromagnetic radiation utilized during the printing.

The mask 122 may be removably applied to the backside of the reticle, and may be applied with any of the methods discussed above with reference to application of the masking material 42 of FIG. 6. The mask 122 is asymmetric relative to the symmetry the reticle, and specifically lacks symmetry along the mirror planes 71 and 73.

Radiation may be passed through zones 104, 106, 108, 110, 112, 114, 118 and 120 while the mask blocks zone 116 to print a pattern in a radiation-sensitive material. Subsequently, mask 122 may be removed, and either other masks applied or reticle 100 used without masks to print other patterns.

Some of the embodiments described herein may advantageously enable asymmetric masks to be removably applied to reticles. In conventional processing, it is difficult to asymmetrically modify a reticle, and any modifications made tend to permanently alter the reticle. Among other advantages of at least some embodiments are that areas of a reticle affected by treatment may be accurately controlled (to within a few microns, or possibly to even tighter tolerances), the birefringence of a reticle is not affected unless such is desired, and there is an ability to induce selective polarization on particular areas of a reticle. Further, some embodiments may utilize completely reversible masking, which may enable the same reticle to be utilized for printing numerous different patterns.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a reticle and using the reticle for multiple applications, comprising:
    forming the reticle to have multiple patterns tailored for multiple different applications; the reticle having a front side and a backside, the patterns being formed along the front side; one of the patterns being a first pattern tailored for a first application, and another of the patterns being a second pattern tailored for a second application;
    applying masking material across a portion of the backside of the reticle to block light from passing through at least part of the second pattern during a first photolithographic process to photolithographically pattern a first substrate;
    after the first photolithographic process, removing the masking material from across the portion of the backside of the reticle; and
    after removing the masking material from across the portion of the backside of the reticle, passing light through an entirety of said second pattern during a second photolithographic process to photolithographically pattern a second substrate.

2. The method of claim 1 wherein the first and second patterns physically overlap with one another along the front side of the reticle.

3. The method of claim 1 wherein the first and second patterns do not physically overlap with one another.

4. The method of claim 1 wherein the masking material comprises one or more of aluminum, chromium, gold, molybdenum, platinum and tungsten.

5. A method of forming and using a reticle, comprising:
    forming the reticle to have an overall pattern that comprises at least two sub-patterns; one of the sub-patterns being a first sub-pattern and the other being a second sub-pattern; the reticle having a front side and a backside, and the overall pattern being formed along the front side;
    using the reticle during photolithographic patterning of a first set of substrates, the photolithographic patterning using at least one primary wavelength of electromagnetic radiation that is passed through both the first and second sub-patterns;
    forming a mask across a portion of the backside of the reticle to block transmission of the at least one primary wavelength of electromagnetic radiation through the first sub-pattern; and
    while the mask is across the portion of the backside of the reticle, using the reticle during photolithographic patterning of a second set of substrates.

6. The method of claim 5 wherein the first set of substrates is photolithographically patterned before the second set of substrates is photolithographically patterned.

7. The method of claim 5 wherein the first set of substrates is photolithographically patterned after the second set of substrates is photolithographically patterned.

8. The method of claim 5 wherein the mask comprises one or more of aluminum, chromium, gold, molybdenum, platinum and tungsten.

9. The method of claim 5 further comprising, after the photolithographic patterning of the second set of substrates:
    stripping the mask; and
    using the reticle for patterning a third set substrates.

10. The method of claim 5 wherein the mask is a first mask, wherein the blocked portion of the reticle is a first portion, and further comprising, after the photolithographic patterning of the second set of substrates:
    stripping the first mask;
    forming a second mask across a second portion of the backside of the reticle to block transmission of the at least one primary wavelength of electromagnetic radiation through the second sub-pattern; and
    while the second mask is across the second portion of the reticle, using the reticle for patterning a third set substrates.

* * * * *